(12) United States Patent
Mouli

(10) Patent No.: US 7,494,901 B2
(45) Date of Patent: Feb. 24, 2009

(54) METHODS OF FORMING SEMICONDUCTOR-ON-INSULATOR CONSTRUCTIONS

(75) Inventor: Chandra Mouli, Boise, ID (US)

(73) Assignee: Microng Technology, Inc., Boise, ID (US)

( * ) Notice: Subject to any disclaimer, the term of this patent is extended or adjusted under 35 U.S.C. 154(b) by 40 days.

(21) Appl. No.: 10/118,393

(22) Filed: Apr. 5, 2002

(65) Prior Publication Data

US 2003/0189229 A1 Oct. 9, 2003

(51) Int. Cl.
*H01L 21/20* (2006.01)

(52) U.S. Cl. .............. 438/479; 438/407; 438/480; 438/295; 257/E21.561; 257/E21.563; 257/E21.564

(58) Field of Classification Search ............ 438/473, 438/766, 776, 479, 480, 404, 406, 455, 459, 438/164, 458, 407, 295; 257/347, 349, 376, 257/386, 326, E21.561, E21.563, E21.564
See application file for complete search history.

(56) References Cited

U.S. PATENT DOCUMENTS

| | | | | |
|---|---|---|---|---|
| 4,786,608 A * | 11/1988 | Griffith | ............ | 438/766 |
| 5,071,785 A | 12/1991 | Nakazato et al. | ............ | 436/457 |
| 5,468,657 A * | 11/1995 | Hsu | ............ | 438/766 |
| 5,516,707 A | 5/1996 | Loh et al. | ............ | 438/302 |
| 5,767,548 A | 6/1998 | Wondrak et al. | ............ | 257/347 |
| 5,795,813 A | 8/1998 | Hughes et al. | ............ | 438/423 |
| 6,071,791 A | 6/2000 | Hughes et al. | ............ | 438/423 |
| 6,144,072 A * | 11/2000 | Iwamatsu et al. | ............ | 257/347 |
| 6,249,026 B1 | 6/2001 | Matsumoto et al. | ............ | 257/349 |
| 6,410,938 B1 * | 6/2002 | Xiang | ............ | 257/49 |
| 6,509,613 B1 * | 1/2003 | En et al. | ............ | 257/349 |
| 6,596,570 B2 * | 7/2003 | Furukawa | ............ | 438/162 |
| 6,958,282 B1 * | 10/2005 | Huttner et al. | ............ | 438/407 |
| 6,992,355 B2 | 1/2006 | Mouli | | |
| 2001/0039098 A1 * | 11/2001 | Lu | ............ | 438/407 |
| 2002/0145174 A1 | 10/2002 | Aipperspach et al. | | |
| 2003/0034524 A1 * | 2/2003 | Horiuchi | ............ | 257/347 |
| 2004/0108566 A1 * | 6/2004 | Himi et al. | ............ | 257/499 |
| 2004/0175899 A1 * | 9/2004 | Lu et al. | ............ | 438/407 |
| 2005/0287723 A1 | 12/2005 | Mouli | | |
| 2006/0003562 A1 | 1/2006 | Mouli | | |

OTHER PUBLICATIONS

"Novel NICE (Nitrogen Implantation into CMOS Gate Electrode and Source-Drain) Structure for High Reliability and High Performance . . . "; T. Kuroi et al.; 1993 IEEE; pp. 13.2.1-13.2.4.
"Dopant Redistribution in SO1 during RTA: A Study on Doping in Scaled-down SI Layers"; Heemyong Park et al; 1999 IEEE.

* cited by examiner

*Primary Examiner*—Matthew Smith
*Assistant Examiner*—Julio J. Maldonado
(74) *Attorney, Agent, or Firm*—Wells St. John P.S.

(57) ABSTRACT

The invention encompasses a method of forming a semiconductor-on-insulator construction. A substrate is provided. The substrate includes a semiconductor-containing layer over an insulative mass. The insulative mass comprises silicon dioxide. A band of material is formed within the insulative mass. The material comprises one or more of nitrogen argon, fluorine, bromine, chlorine, iodine and germanium.

39 Claims, 4 Drawing Sheets

METHODS OF FORMING SEMICONDUCTOR-ON-INSULATOR CONSTRUCTIONS

TECHNICAL FIELD

The invention pertains to semiconductor-on-insulator constructions (such as silicon-on-insulator constructions, or SiGe-on-insulator constructions), and to methods of forming semiconductor-on-insulator constructions. In particular aspects, the invention pertains to transistor devices associated with semiconductor-on-insulator constructions, and methods of forming such devices.

BACKGROUND OF THE INVENTION

A prior art semiconductor-on-insulator construction is described with reference to FIG. 1. Specifically, FIG. 1 illustrates a fragment 10 of a semiconductor-on-insulator construction. The construction includes a substrate 12 having an insulative material 14 formed thereover, and further comprises a semiconductor-containing material 16 formed over insulative material 14.

Substrate 12 can comprise, for example, silicon and/or germanium. If the substrate comprises silicon, the silicon can be in the form of, for example, polycrystalline silicon and/or monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Insulative material 14 can comprise, consist essentially of, or consist of silicon dioxide and/or nitrided oxides.

Semiconductor-containing material 16 can comprise, consist essentially of, or consist of monocrystalline silicon or other semiconductor materials, such as, for example, SiGe heterostructures. In particular applications, semiconductor-containing material 16 will consist essentially of, or consist of, monocrystalline silicon doped with either an n-type dopant or a p-type dopant, with an exemplary p-type dopant being boron.

A transistor device 18 is shown associated with semiconductor-containing material 16. Transistor device 18 includes a transistor gate 20 separated from semiconductor-containing material 16 by a dielectric material 22, and includes source/drain regions 26 and 28. Dielectric material 22 can comprise, for example, silicon dioxide, and can be referred to as a gate oxide. Gate 20 can comprise various conductive materials, including, for example, metals, metal alloys, silicides, and/or conductively-doped silicon. In particular applications, gate 20 will comprise a stack which includes, in ascending order from dielectric material 22, a layer of conductively-doped silicon, a layer of silicide, and a layer of metal.

Gate 20 defines a channel region 24 within semiconductor-containing material 16, and corresponding to a portion of the semiconductor-containing material 16 proximate the gate 20. In the shown construction, channel region 24 corresponds to the portion of semiconductor-containing material 16 immediately under gate 20, and separated from gate 20 by dielectric material 22.

Sidewall spacers 30 are formed along sidewall edges of gate 20. Sidewall spacers can comprise, for example, silicon nitride and/or silicon dioxide.

Source/drain regions 26 and 28 are formed within semiconductor-containing material 16, and separated from one another by channel region 24. Source/drain regions 26 and 28 can comprise, for example, n-type doped diffusion regions within semiconductor-containing material 16 and/or p-type doped diffusion regions within semiconductor-containing material 16. In the shown construction, the source/drain regions comprise a lightly-doped portion 32 beneath spacers 30, and a heavily-doped portion 34 laterally outward of lightly-doped portion 32 relative to channel region 24.

A continuing goal in semiconductor device fabrication is to reduce an amount of semiconductor real estate consumed by transistor devices. Several problems occur, however. For instance, problems can occur as the length of channel region 24 between source/drain regions 26 and 28 is decreased. Such problems are commonly referred to as short-channel effects. A particular effect which is found to become problematic is drain-induced barrier lowering (DIBL), which is due to charge sharing between the source and drain of a transistor device. DIBL results from lowering of a potential barrier at the source region due to high potential near the drain for short length devices.

It would be desirable to develop semiconductor constructions which alleviate, and preferably prevent, short-channel effects, as well as to develop methods of forming such constructions.

SUMMARY OF THE INVENTION

In one aspect, the invention encompasses a method of forming a semiconductor-on-insulator construction. A substrate is provided. The substrate includes a semiconductor-containing layer over an insulative mass. The insulative mass comprises silicon dioxide. A band of material is formed within the insulative mass. The material comprises one or more of nitrogen, argon, fluorine, bromine, chlorine, iodine and germanium.

In another aspect, the invention encompasses a semiconductor-on-insulator construction. The construction includes a substrate having an insulative mass supported thereby. The insulative mass comprises silicon dioxide. A band of nitrogen is within the insulative mass, and a semiconductor-containing layer is over the insulative mass.

In yet another aspect, the invention encompasses transistor devices associated with semiconductor-on-insulator constructions, and methods of forming such devices.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 2:
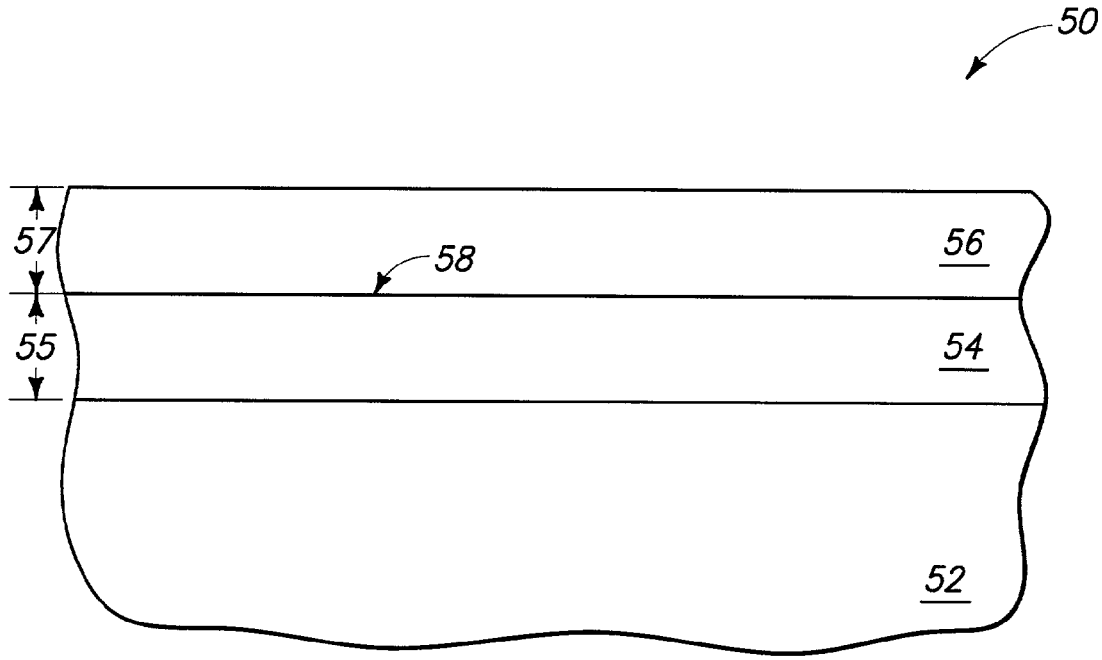
FIG. 2 is a diagrammatic, cross-sectional view of a fragment of a prior art-semiconductor-on-insulator construction.

A first aspect of the invention is described with reference to FIGS. 2-4. Referring initially to FIG. 2, a fragment 50 of a prior art semiconductor-on-insulator construction is illustrated. Fragment 50 comprises a substrate 52, an insulative mass 54 supported by the substrate, and a semiconductor-containing layer 56 (such as a silicon-containing layer or a SiGe-containing layer) over the insulative mass. Substrate 52 can comprise, for example, a semiconductive material, such as, for example, polycrystalline silicon and/or monocrystalline silicon. Substrate 52 typically functions as a handle during manipulation of the semiconductor-on-insulator construction.

Insulative mass 54 can comprise, consist essentially of, or consist of silicon dioxide. Mass 54 has a thickness 55, and such thickness is typically from less than or equal to about 300 Å to about 1,000 Å.

Semiconductor-containing material 56 can comprise, consist essentially of, or consist of SiGe or monocrystalline silicon, and typically will comprise, consist essentially of, or consist of monocrystalline silicon doped with either p-type dopant or n-type dopant. An exemplary p-type dopant is boron, and exemplary n-type dopants are arsenic and phosphorous. Layer 56 comprises a thickness 57, and such thickness will typically be about 1,000 Angstroms.

In the shown construction, layer 56 physically contacts insulative mass 54, and accordingly joins to insulative mass 54 at an interface 58. A difficulty in forming semiconductor-on-insulator constructions can occur in attempting to form a uniform and tight interface between mass 54 and layer 56. A good interface between mass 54 and layer 56 would comprise a quick stoichiometric jump between the material of layer 54 (for example, silicon dioxide) and the material of layer 56 (for example, silicon). However, interface 58 frequently comprises a region of diffusion between materials from mass 54 and layer 56, and accordingly there is a diffused region of stoichiometric jump between materials 54 and 56. Such region can comprise dangling bonds, which can produce acceptor/carrier trap sites. The trap sites can contribute to short channel effects.

The construction 50 can be formed by numerous methods. Such methods can include starting with a monocrystalline substrate corresponding to layer 56, subsequently growing layers 54 and 52 over the substrate, and then inverting the construction to form the construction 50 of FIG. 2. Methods can also include wafer bonding. In wafer bonding methods, a first substrate can comprise layer 56 and a portion of insulative mass 54, a second substrate can comprise layer 52 and another portion of insulative mass 54, and the two substrates can be fused together at a high temperature to form the construction 50. In yet other methods, construction 50 can be formed by a so-called SIMOX (for separation by implanted oxygen) method, in which a silicon substrate is initially provided, and then oxygen is implanted into the substrate to form the silicon dioxide mass 54. The implanted oxygen simultaneously defines regions 52 and 56 within the substrate as the region 54 is formed.

Figure 3:
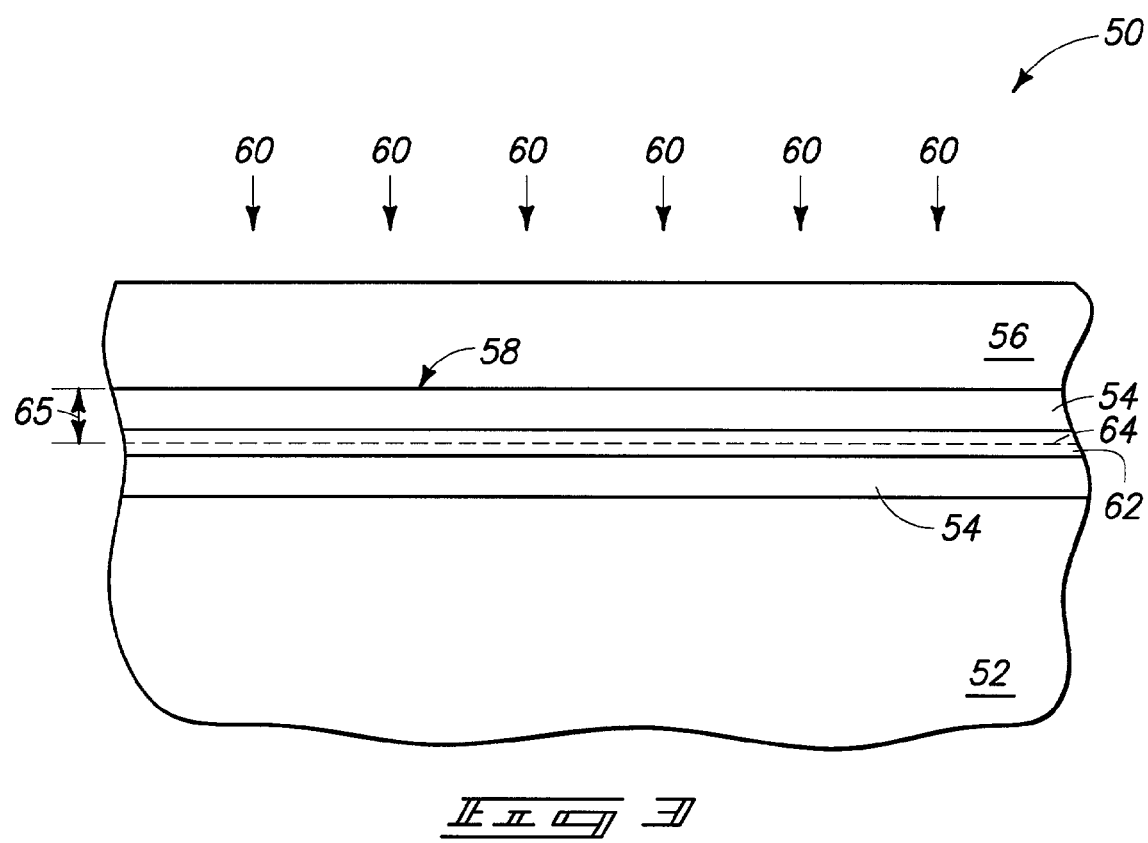
FIG. 3 is a diagrammatic, cross-sectional view of the fragment of FIG. 2 shown at a processing stage subsequent to that of FIG. 2 in accordance with an aspect of the present invention.
Figure 8:
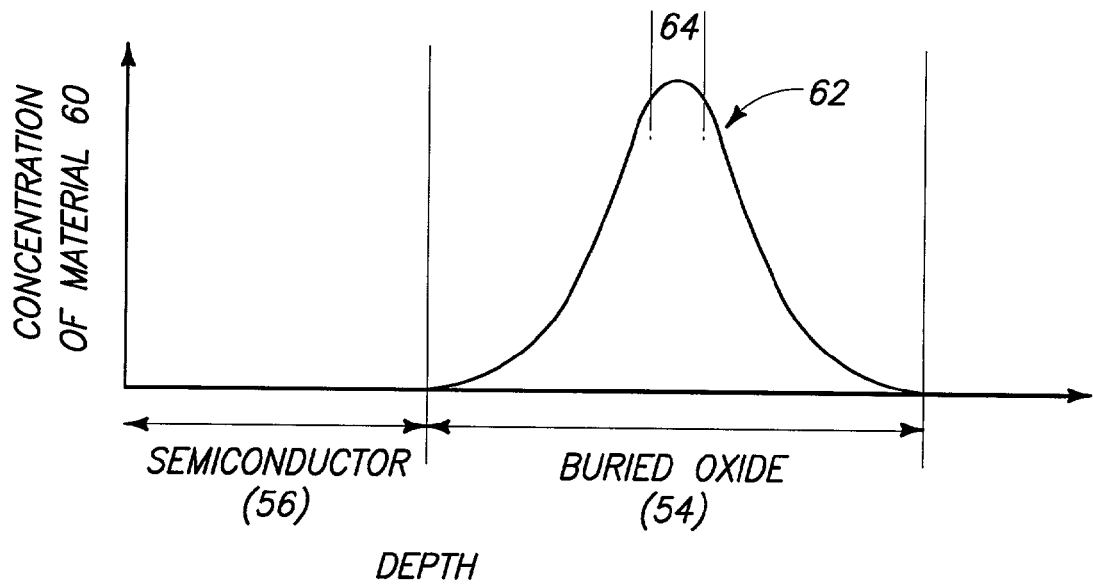
FIG. 8 is a diagrammatic and graphical view of a portion of the FIG. 3 structure.

Referring to FIG. 3, a material 60 is implanted through layer 56 and into mass 54 to form a band 62 (or barrier) of the material within mass 54. The band 62 will typically comprise a gradient of concentration of material 60 (such as, for example, a gaussian distribution of the concentration of material 60 as illustrated in FIG. 8), and a region approximately in the center of band 62 will comprise a peak (or highest) concentration of the barrier material. Such peak concentration region is illustrated diagrammatically with a dashed line 64. The peak concentration of band 62 will preferably be within an upper half of mass 54, and in particular applications can be within an upper third of mass 54. Further, the peak concentration 64 within band 62 is preferably a distance 65 from the interface 58 between semiconductor-containing layer 56 and mass 54 of at least about 100 Angstroms, and in particular applications about 100 Angstroms to about 500 Angstroms from the interface. In exemplary applications, an entirety of band 62 is within the upper half, or even upper third, of mass 54.

Barrier material 60 can comprise, consist essentially of, or consist of, one or more of nitrogen, argon, fluorine, bromine, chlorine, iodine and germanium. If the material comprises one or more of nitrogen, argon, fluorine, bromine, chlorine, iodine and germanium, it is to be understood that the material can comprise compounds which include other elements in addition to nitrogen, argon, fluorine, bromine, chlorine, iodine and germanium; as well as including compounds or compositions which do not comprise nitrogen, argon, fluorine, bromine, chlorine, iodine and germanium. However, the nitrogen, argon, fluorine, bromine, chlorine, iodine and/or germanium will be typically distributed uniformly throughout band 62. In applications in which the barrier material consists of one or more of nitrogen, argon, fluorine, bromine, chlorine, iodine and germanium, it is to be understood that the barrier material will only contain either atomic forms of nitrogen, argon, fluorine, bromine, chlorine, iodine and germanium; or compounds which consist only of nitrogen, argon, fluorine, bromine, chlorine, iodine and/or germanium. For instance, barrier material 62 can consist of nitrogen, and include atomic nitrogen and/or diatomic nitrogen ($N_2$).

In particular applications, barrier material 60 will comprise, consist essentially of, or consist of, $N_2$. The $N_2$ can be implanted into insulative mass 54 at a dose of from about $5 \times 10^{14}$ atoms/cm$^2$ to about $2 \times 10^{15}$ atoms/cm$^2$. The nitrogen can be implanted at about room temperature, and in particular applications can be implanted at a temperature of from about 0° C. to about 40° C. The peak nitrogen concentration within mass 54 will preferably be at least about $1 \times 10^{15}$ atoms/cm$^3$, and can be, in particular applications, at least about $1 \times 10^{20}$ atoms/cm$^3$.

Figure 5:
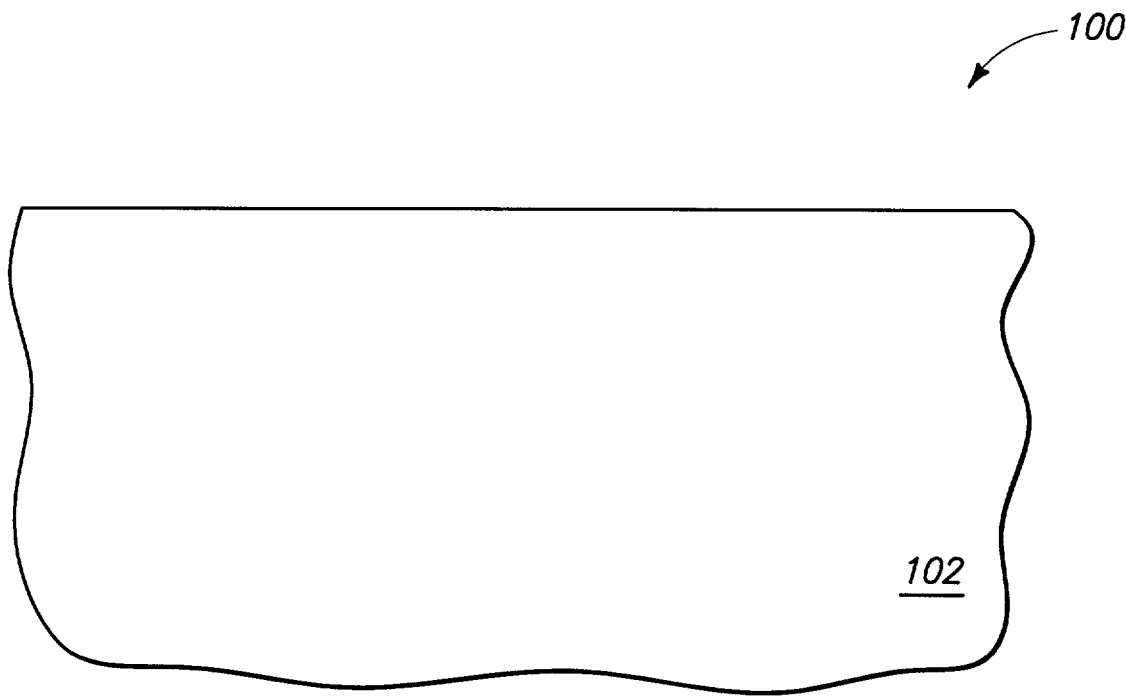
FIG. 5 is a diagrammatic, cross-sectional view of a fragment of a prior art semiconductive material.
Figure 6:
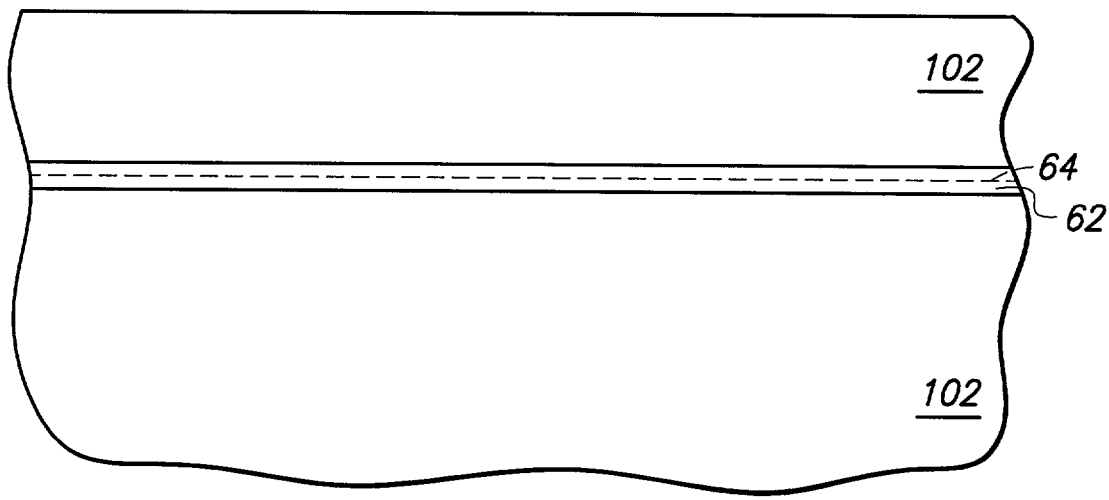
FIG. 6 is a view of the FIG. 5 fragment shown at a processing stage subsequent to that of FIG. 5 in accordance with an aspect of the present invention.
Figure 7:
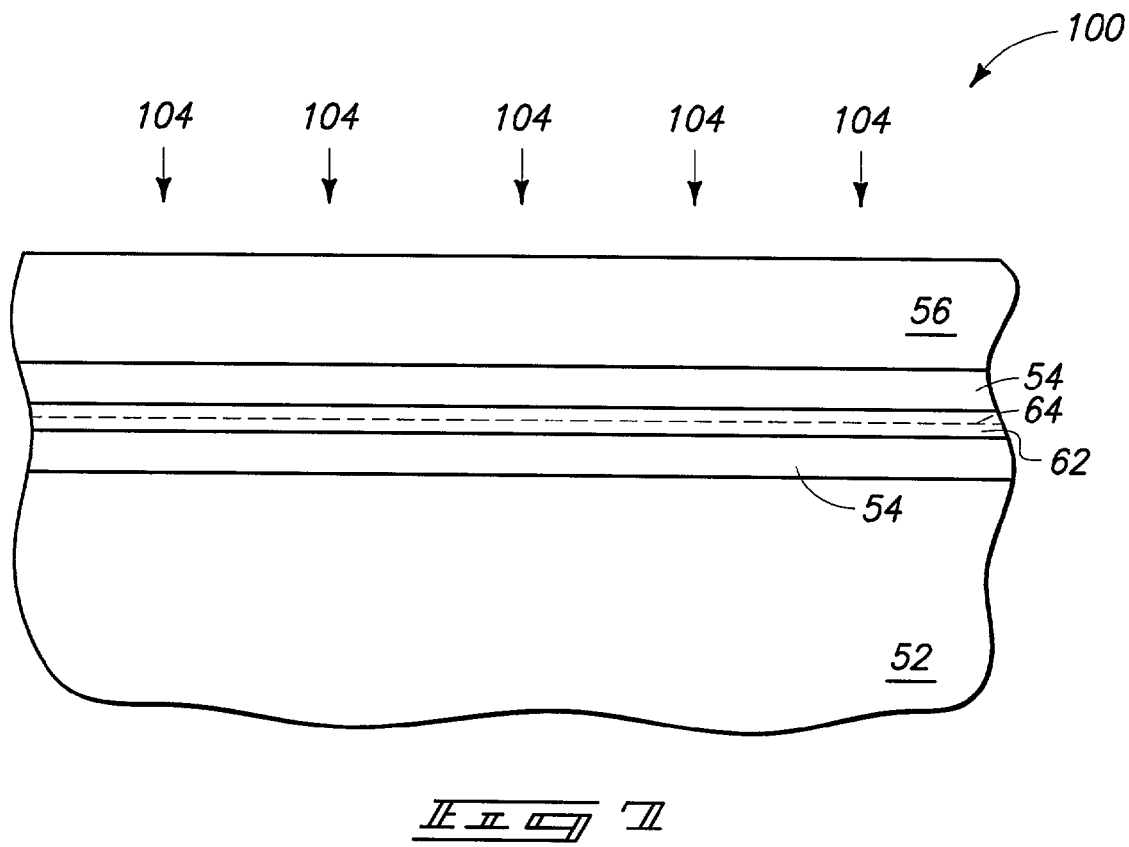
FIG. 7 is a view of the FIG. 5 fragment shown at a processing stage subsequent to that of FIG. 6 in accordance with an aspect of the present invention.

Although the shown embodiment comprises implanting barrier material 60 after formation of semiconductor-containing layer 56 over mass 54, it is to be understood that barrier material 60 can also be implanted prior to formation of the semiconductor-containing layer. For instance, an embodiment described below with reference to FIGS. 5-7 illustrates implantation of material 60 into a semiconductor-containing substrate prior to formation of insulative mass 54 within the substrate. In yet another aspect, construction 50 can be formed by a wafer-bonding process. Band 62 can be provided within a substrate comprising mass 52 and a portion of mass 54; and subsequently such substrate can be wafer bonded to a second substrate comprising mass 56 and another portion of mass 54. In such aspects, band 62 is formed within mass 54 prior to formation of layer 56 over the mass 54.

Figure 1:
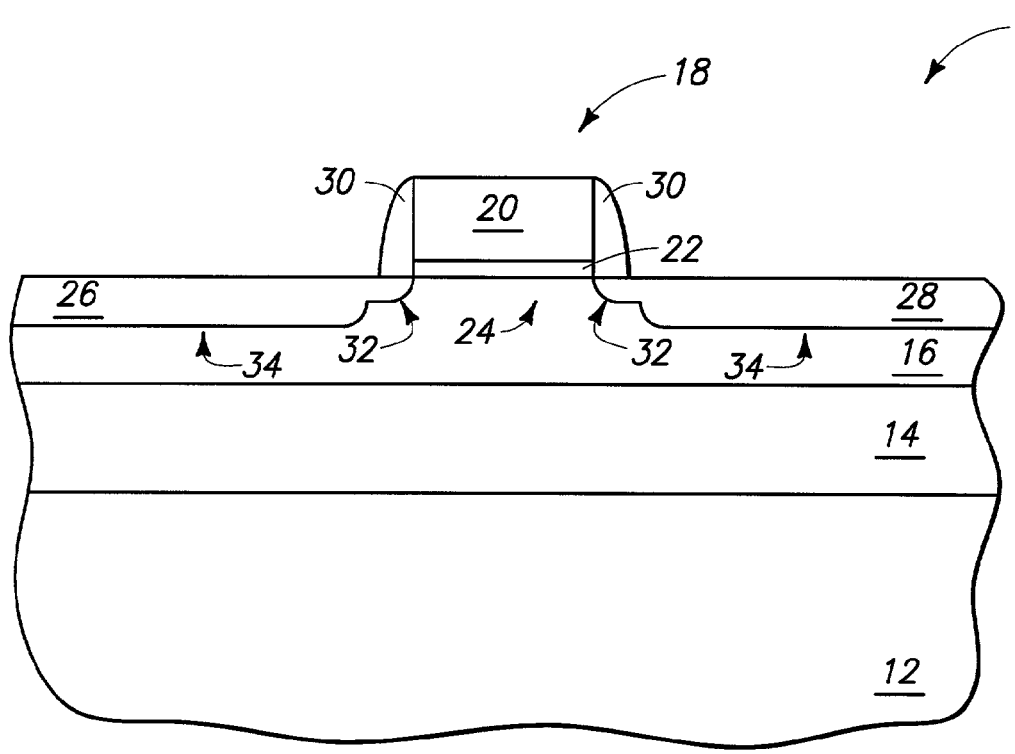
FIG. 1 is a diagrammatic, cross-sectional view of a fragment of a prior art semiconductor-on-insulator construction.
Figure 4:
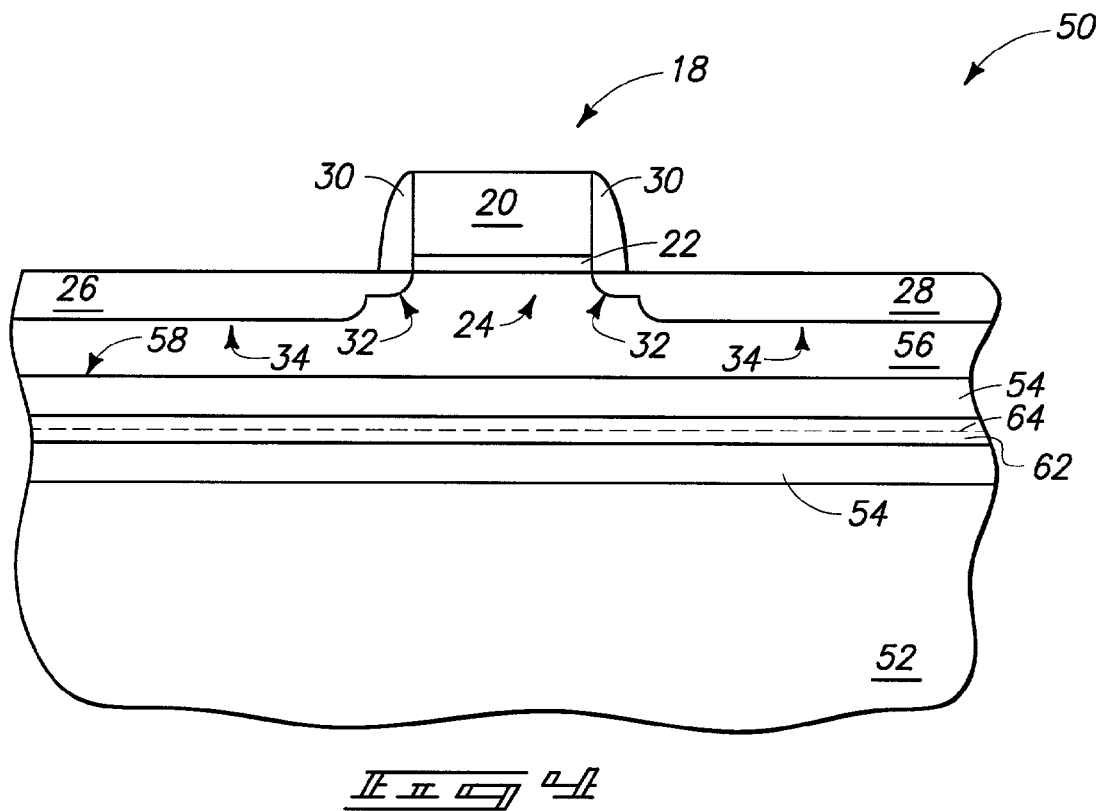
FIG. 4 is a view of the FIG. 2 fragment shown at a processing stage subsequent to that of FIG. 3 in accordance with an aspect of the present invention.

Referring to FIG. 4, a transistor device 18 is formed to be associated with semiconductor-on-insulator construction 50. Device 18 in FIG. 4 is labeled with identical numbers as were utilized above in describing the transistor device of FIG. 1, to indicate that transistor device 18 of FIG. 4 can comprise the same materials and construction of the prior art device of FIG. 1. The barrier material within band 62 can inhibit, and in particular applications prevent, dopant diffusion and segregation within semiconductor-containing layer 56 proximate interface 58. Accordingly, the band of barrier material can alleviate, and in particular applications prevent, dopant diffusion proximate channel region 24 which would otherwise exacerbate short-channel effects.

An advantage of forming band 62 at least 100 Angstroms beneath interface 58 is that such can avoid formation of additional trap states within interface 58 resulting from the implant of the barrier material. However, band 62 should be close enough to interface 58 to have the desired effect of alleviating (and in particular applications preventing) dopant diffusion within semiconductor-containing layer 56 proximate interface 58, and accordingly band 62 is preferably within the top half, and more preferably within the top third, of mass 54. Band 62 can thus enable retention of high concentrations of both donor and acceptor levels in silicon near interface 58 (frequently referred to as a silicon/buried oxide (BOX) interface). Additionally, if the barrier material comprises $N_2$, transient-enhanced diffusion (TED) can occur to increase dopant pile-up at interface 58, which can further help to control short-channel effects.

The barrier material within band 62 is preferably subjected to high temperature processing (such as, for example, rapid thermal processing) after implantation of the barrier material within mass 54. Such thermal processing preferably occurs before formation of source/drain regions 26 and 28, to avoid diffusion of the dopants utilized in the source/drain regions during the high temperature processing. Exemplary high temperature processing of a barrier material (such as, for example, $N_2$) can comprise a high temperature (greater than 1000° C.) furnace anneal in an inert ambient gas (such as, for example, $N_2$) for a time of from about 30 minutes to about 1 hour. Alternatively, the high temperature processing can comprise subjecting a barrier material to a rapid thermal anneal to greater than 1000° C. for a time of from about 10 seconds to about 30 seconds.

The high temperature processing can anneal defects which occur within masses 54 and 56 during the implant of the barrier material.

An advantage of forming the nitrogen within the insulative mass 54, rather than in other locations relative to transistor device 18, is that such can limit diffusion of nitrogen into regions of the transistor device where the nitrogen is unwanted. For instance, if nitrogen reaches an interface between gate oxide 22 and semiconductor-containing layer 56, it can potentially increase interface charge density and trap states, which can negatively impact device reliability. However, the formation of nitrogen within band 62 in mass 54 can effectively segregate the nitrogen from transistor device 18, and avoid negative effects of the nitrogen on the device.

Among the advantages that band 62 of the barrier material can offer, relative to prior art constructions, (such as the construction of FIG. 1) is better short channel effects control for threshold voltage adjustments in the channel region (24 of FIG. 4), as well as relative to halo implant regions associated with source/drain regions 26 and 28. Additionally, an implant energy utilized for implanting the barrier material into the buried oxide 54 can be carefully controlled to implant the nitrogen deep enough within mass 54 to avoid formation of trap states, or other degradation, relative to interface 58 between mass 54 and semiconductor-containing layer 56.

Further aspects of the invention are described with reference to FIGS. 5-7. Referring initially to FIG. 5, a fragment 100 of a semiconductor-containing mass 102 is illustrated. Semiconductor-containing mass 102 can comprise, for example, SiGe or monocrystalline silicon, and in particular applications can be doped with n-type or p-type dopant, such as, for example, boron. Mass 102 can, for example, correspond to a fragment of a monocrystalline silicon wafer.

Referring to FIG. 6, barrier material 60 is implanted into mass 102 to form band 62 of the barrier material.

Referring to FIG. 7, oxygen 104 is implanted into fragment 100 to form insulative mass 54 within the fragment, and simultaneously define the region 52 beneath mass 54 and the semiconductor-containing layer 56 over mass 54. The construction of FIG. 7 can correspond identically to the construction of FIG. 3, and can be subjected to further processing to form a transistor device associated with the construction.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a semiconductor-on-insulator construction, comprising:
   providing a substrate;
   forming a semiconductor-containing layer over the substrate;
   forming a band of material comprising a first thickness within the substrate, the band of the material comprising one or more of fluorine, bromine, chlorine and iodine;
   after forming the band of the material, forming an insulative mass that includes the band of the material within the substrate, the insulative mass comprising a second thickness that is different from the first thickness; and
   using the semiconductor-containing layer to form at least one semiconductor device, wherein after the forming of the at least one semiconductor device, an entirety of the band of the material is remains spaced from the semiconductor-containing layer.

2. The method of claim 1 wherein the semiconductor-containing layer comprises one or both of Si and Ge.

3. The method of claim 1 wherein the material consists essentially of one or more of fluorine, bromine, chlorine and iodine.

4. The method of claim 1 wherein the material consists of one or more of fluorine, bromine, chlorine and iodine.

5. The method of claim 1 wherein the semiconductor-containing layer is formed over the insulative mass, and wherein the band of the material is formed prior to the semiconductor-containing layer being formed over the insulative mass.

6. The method of claim 1 wherein the semiconductor-containing layer is formed over the insulative mass, and wherein the band of the material is formed within the insulative mass simultaneously with the semiconductor-containing layer being formed over the insulative mass.

7. The method of claim 1 wherein the band of the material is formed to have a peak concentration within an upper half of the second thickness of the insulative mass.

8. The method of claim 1 wherein the band of the material is formed to have a peak concentration within an upper third of the second thickness of the insulative mass.

9. The method of claim 1 wherein the semiconductor-containing layer physically contacts the insulative mass; wherein an interface is defined at a location where the semiconductor-containing layer joins the insulative mass; and wherein the band of the material is formed to have a peak concentration at least 100 Angstroms from the interface.

10. The method of claim 1 wherein the semiconductor-containing layer comprises SiGe.

11. The method of claim 1 wherein the semiconductor-containing layer comprises monocrystalline silicon.

12. The method of claim 1 wherein the semiconductor-containing layer consists essentially of monocrystalline silicon.

13. The method of claim 1 further comprising subjecting the band of the material to rapid thermal processing.

14. The method of claim 1 wherein the second thickness comprises less than or equal to about 300 Å to about 1,000 Å.

15. The method of claim 1 wherein the second thickness is greater than the first thickness.

16. The method of claim 1 wherein the forming of the band of the material comprises implanting the band of the material into the substrate.

17. The method of claim 1 wherein the using of the semiconductor-containing layer to form at least one semiconductor device comprises forming a transistor gate over and against the semiconductor-containing layer.

18. The method of claim 1 wherein the using of the semiconductor-containing layer to form at least one semiconductor device comprises forming a transistor gate over and against the semiconductor-containing layer, and further comprising forming spacers adjacent opposites sides of the transistor gate, the spacers comprising silicon dioxide.

19. A method of forming a semiconductor-on-insulator construction, comprising:
   providing a substrate comprising a semiconductor-containing layer;
   forming a band of material within the substrate, the material comprising one or more of argon, bromine, chlorine, iodine and germanium;
   after forming the band of the material, forming an insulative mass comprising an interface with the semiconductor-containing layer and that includes the band of the material within the substrate;
   subjecting the band of the material to rapid thermal processing for a period of time comprising from about 30 minutes to about 1 hour; and
   wherein after the rapid thermal processing, the band of the material is spaced from the interface.

20. The method of claim 19 wherein the rapid thermal processing comprises rapid thermal annealing to a temperature of greater than about 1000° C.

21. The method of claim 19 wherein the insulative mass has a thickness, and wherein an entirety of the band of the material is formed within an upper half of the thickness.

22. The method of claim 19 wherein the insulative mass has a thickness, and wherein an entirety of the band of the material is formed within an upper third of the thickness.

23. The method of claim 19 wherein the insulative mass comprises a thickness that is different from a thickness of the band of the material.

24. The method of claim 19 wherein the insulative mass comprises a thickness of less than or equal to about 300 Å to about 1,000 Å.

25. The method of claim 19 wherein the insulative mass comprises a thickness that is greater than a thickness of the band of the material.

26. The method of claim 19 further comprising forming a transistor gate over and against the semiconductor-containing layer.

27. The method of claim 19 further comprising:
   forming a transistor gate over and against the semiconductor-containing layer; and
   forming spacers adjacent opposites sides of the transistor gate, the spacers comprising silicon dioxide.

28. The method of claim 19 further comprising forming a transistor gate over the semiconductor-containing layer, and wherein after the forming of the transistor gate, an entirety of the band of the material remains spaced from the interface.

29. the method of claim 19 wherein the band of material comprises one or more of bromine, chlorine, iodine and germanium.

30. A method of forming a semiconductor-on-insulator construction, comprising:
   providing a substrate;
   forming a semiconductor-containing layer over the substrate;
   forming a band of material within the substrate, the band of the material comprising one or more of fluorine, bromine, chlorine and iodine;
   after forming the band of the material, forming an insulative mass that includes the band of the material within the substrate, wherein the forming of the semiconductor-containing layer over the substrate occurs simultaneously with the forming of the insulative mass; and
   wherein the insulative mass has a thickness, and wherein the band of the material is formed to have a peak concentration within an upper half of the thickness.

31. The method of claim 30 wherein the band of the material is formed to have a peak concentration within an upper third of the thickness.

32. A method of forming a semiconductor-on-insulator construction, comprising:
   providing a substrate comprising a semiconductor-containing layer;
   forming a transistor gate over and against the semiconductor-containing layer;
   forming a band of material within the substrate, the material comprising one or more of nitrogen, argon, fluorine, bromine, chlorine, iodine and germanium;
   after forming the band of the material, forming an insulative mass that includes the band of the material within the substrate;
   subjecting the band of the material to rapid thermal processing;
   wherein the insulative mass has a thickness, and wherein an entirety of the band of the material is formed within an upper half of the thickness; and
   wherein after the forming of the transistor gate, an entirety of the band of the material remains spaced from the semiconductor-containing wall.

33. The method of claim 32 wherein an entirety of the band of the material is formed within an upper third of the thickness of the insulative mass.

34. The method of claim 32 further comprising forming spacers adjacent opposites sides of the transistor gate, the spacers comprising silicon dioxide.

35. A method of forming a semiconductor-on-insulator construction, comprising:
 providing a substrate;
 forming a semiconductor-containing layer over the substrate;
 forming a band of material comprising a first thickness within the substrate, the band of the material comprising one or more of fluorine, bromine, chlorine and iodine;
 after forming the band of the material, forming an insulative mass that includes the band of the material within the substrate, the insulative mass comprising a second thickness that is different from the first thickness; and
 wherein the semiconductor-containing layer is formed over the insulative mass, and wherein the band of the material is formed within the insulative mass simultaneously with the semiconductor-containing layer being formed over the insulative mass.

36. A method of forming a semiconductor-on-insulator construction, comprising:
 providing a substrate;
 forming a semiconductor-containing layer over the substrate;
 forming a band of material comprising a first thickness within the substrate, the band of the material comprising one or more of fluorine, bromine, chlorine and iodine;
 after forming the band of the material, forming an insulative mass that includes the band of the material within the substrate, the insulative mass comprising a second thickness that is different from the first thickness;
 using the semiconductor-containing layer to form at least one semiconductor device, wherein an entirety of the band of the material is spaced from the semiconductor-containing layer; and
 wherein the semiconductor-containing layer is formed over the insulative mass, and wherein the band of the material is formed within the insulative mass simultaneously with the semiconductor-containing layer being formed over the insulative mass.

37. A method of forming a semiconductor-on-insulator construction comprising:
 providing a substrate comprising a semiconductor-containing layer;
 forming a band of material within the substrate;
 after forming the band of the material, forming an insulative mass that includes the band of the material within the substrate;
 subjecting the band of the material to thermal processing; and
 after the subjecting, an entirety of the band of the material remains spaced from the semiconductor-containing layer.

38. The method of claim 37 further comprising forming a transistor gate over the semiconductor-containing layer, and wherein after the forming of the transistor gate, an entirety of the band of the material remains spaced from the semiconductor-containing layer.

39. The method of claim 37 wherein the band of the material comprises one or more of bromine, chlorine, iodine and germanium.

* * * * *